(12) United States Patent
Iura

(10) Patent No.: US 11,123,874 B2
(45) Date of Patent: Sep. 21, 2021

(54) TRANSFER ROBOT AND WORK TRANSFER SYSTEM INCLUDING THE SAME

(71) Applicant: DAIHEN Corporation, Osaka (JP)

(72) Inventor: Jun Iura, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/021,150

(22) Filed: Sep. 15, 2020

(65) Prior Publication Data

US 2021/0078181 A1 Mar. 18, 2021

(30) Foreign Application Priority Data

Sep. 18, 2019 (JP) .............................. JP2019-169369

(51) Int. Cl.
*B25J 9/04* (2006.01)
*B25J 11/00* (2006.01)
*B25J 19/00* (2006.01)
*B25J 15/00* (2006.01)

(52) U.S. Cl.
CPC ........... *B25J 11/0095* (2013.01); *B25J 9/042* (2013.01); *B25J 9/047* (2013.01); *B25J 19/0008* (2013.01); *B25J 15/0014* (2013.01)

(58) Field of Classification Search
None
See application file for complete search history.

(56) References Cited

U.S. PATENT DOCUMENTS

| 4,732,525 | A | * | 3/1988 | Neumann | B25J 9/0069 414/729 |
| 6,121,743 | A | * | 9/2000 | Genov | B25J 9/042 318/568.11 |
| 2015/0114160 | A1 | * | 4/2015 | Sato | B25J 9/101 74/490.01 |
| 2017/0125279 | A1 | | 5/2017 | Kirino et al. | |
| 2020/0391374 | A1 | * | 12/2020 | Brogardh | F16H 37/12 |
| 2021/0086373 | A1 | * | 3/2021 | Riff | B25J 17/0275 |
| 2021/0154866 | A1 | * | 5/2021 | Wells | B25J 19/0008 |

FOREIGN PATENT DOCUMENTS

JP 2017-085015 A 5/2017

* cited by examiner

*Primary Examiner* — Gerald McClain
(74) *Attorney, Agent, or Firm* — Hamre, Schumann, Mueller & Larson, P.C.

(57) ABSTRACT

A transfer robot includes a support unit, a rotary base supported by the support unit, a rotation mechanism that rotates the rotary base, a hand unit supported by the rotary base and configured to support a work, and a linear movement mechanism that moves the hand unit in a horizontal direction relative to the rotary base. The rotation mechanism includes a first rotation mechanism that rotates the rotary base relative to the support unit about a first rotation axis extending in a vertical direction, and a second rotation mechanism that rotates the rotary base about a second rotation axis inclined by a predetermined angle with respect to the first rotation axis. The support unit includes a pivotal member that pivots about a pivotal axis perpendicular to the first rotation axis.

6 Claims, 9 Drawing Sheets

(a)　　　(b)

TRANSFER ROBOT AND WORK TRANSFER SYSTEM INCLUDING THE SAME

FIELD

The present disclosure relates to a transfer robot, and a work transfer system including the transfer robot.

BACKGROUND

In a manufacturing process of a semiconductor device, a thin plate-shaped wafer (work) is moved by a transfer robot. When the wafer is to be subjected to a predetermined process, for example in a diffusion furnace, the transfer robot transfers the wafer between a storage chamber in which the wafer is stored and a processing chamber in which the wafer is to be processed. A conventional transfer robot is disclosed, for example, in JP-A-2017-85015.

The conventional transfer robot of JP-A-2017-85015 includes a rotary base (rotary block 5e) configured to rotate, and a hand unit (plurality of plates 5f and one plate 5f) supported by the rotary base. The wafer is placed on the plate 5f of the hand unit. The hand unit can be oriented so as to face the storage chamber and the processing chamber, by rotating the rotary base by a certain angle. The hand unit can also linearly move in a horizontal direction. When the hand unit is linearly moved toward the storage chamber or the processing chamber, the wafer can be delivered from the storage chamber, or to the processing chamber. During the transfer of the wafers, the plurality of plates 5f and one plate 5f can horizontally move toward the transfer chamber, independently from each other. The plurality of plates 5f support a plurality of wafers, such that the wafers overlap with each other as viewed in a vertical direction (e.g., from above). Moving either or both of the plurality of plates 5f and one plate 5f as the case may be enables a required number of wafers to be efficiently transferred.

During the transfer of the wafers, the plurality of plates 5f and one plate 5f are horizontally moved in a cantilever manner, and therefore the components may be distorted, owing to the self-weight of moving parts and the hand unit. In such a case, the hand unit is disabled from maintaining the horizontal posture, and the wafer may fail to be properly delivered between the transfer chamber and the processing chamber. To avoid this, for example, a drive mechanism may be provided at the proximal end of the hand unit, to make the hand unit swing so as to assume the horizontal posture. However, since the plurality of plates 5f and one plate 5f are configured to independently move in the horizontal direction, the drive mechanism has to be provided for each of the plurality of plates 5f and one plate 5f. In this case, the number of parts is considerably increased and the structure becomes more complicated. Further, particles undesirable for the wafer transfer are prone to be generated.

SUMMARY

In light of the above, an object of the present disclosure is to provide a transfer robot that allows the hand unit to maintain a desired posture during the transfer of the wafer, without incurring complication of the structure.

According to a first aspect, there is provided a transfer robot including: a support unit, a rotary base supported by the support unit, a rotation mechanism that rotates the rotary base, a hand unit supported by the rotary base and configured to support a work, and a linear movement mechanism that moves the hand unit in a horizontal direction relative to the rotary base. The rotation mechanism includes a first rotation mechanism and a second rotation mechanism, where the first rotation mechanism is configured to rotate the rotary base relative to the support unit about a first rotation axis extending in a vertical direction, and the second rotation mechanism is configured to rotate the rotary base about a second rotation axis inclined by a predetermined angle with respect to the first rotation axis. The support unit includes a pivotal member that pivots about a pivotal axis perpendicular to the first rotation axis.

In a preferred embodiment, the first rotation axis, the second rotation axis, and the pivotal axis intersect at a point located inside the pivotal member.

In a preferred embodiment, the hand unit includes a first hand and a second hand moved that are linearly moved and operated independently from each other by the linear movement mechanism.

In a preferred embodiment, the first hand supports a plurality of thin plate-shaped works in a manner such that the plurality of thin plate-shaped works overlap with each other as viewed in the vertical direction.

In a preferred embodiment, the support unit includes a fixed base extending in the vertical direction, a first arm, and a second arm, where the first arm has a first proximal end portion supported at an upper end portion of the fixed base in a manner such that the first proximal end portion pivots about a first horizontal axis extending in a first direction, and the second arm has a second proximal end portion supported at a distal end portion of the first arm so as to pivot about a second horizontal axis extending in the first direction. The pivotal member is supported at a distal end portion of the second arm so as to pivot about the pivotal axis extending in the first direction.

According to a second aspect, there is provided a work transfer system including: a transfer robot according to the first aspect of the present disclosure, a transfer chamber in which the transfer robot is located, at least one storage chamber located adjacent to the transfer chamber for storing the work, and a plurality of processing chambers for subjecting the work to a predetermined process. The transfer chamber extends in a second direction perpendicular to the first direction and the vertical direction. The at least one storage chamber is located adjacent to an end portion of the transfer chamber in the second direction. The plurality of processing chambers are each located adjacent to an end portion of the transfer chamber in the first direction, and aligned in the second direction at predetermined intervals.

In the transfer robot configured as above, the rotation mechanism for rotating the rotary base includes the first rotation mechanism and the second rotation mechanism. The first rotation mechanism rotates the rotary base relative to the support unit (pivotal member), about the first rotation axis extending in the vertical direction. The second rotation mechanism rotates the rotary base about the second rotation axis inclined by the predetermined angle with respect to the first rotation axis. The pivotal member supporting the rotary base is configured to pivot about the pivotal axis perpendicular to the first rotation axis. To deliver the work with the transfer robot thus configured, the hand unit supported by the rotary base is moved by the linear movement mechanism to a position forward of the rotary base. At this point, the hand unit is separated from the rotary base in a cantilever manner, and therefore the components of the linear movement mechanism may be distorted, owing to the self-weight of the linear movement mechanism, the hand unit, and the work supported by the hand unit, which may cause the hand unit to tilt, in the front-back direction of the rotary base.

Even in such a case, only the inclination of the rotary base in the front-back direction can be adjusted, without rotating the rotary base, by the collaboration of the rotation mechanism (first rotation mechanism and second rotation mechanism) and the pivotal member. Therefore, the transfer robot configured as above allows the hand unit to maintain the horizontal posture when delivering the work, thereby allowing the work to be properly delivered.

Further, in the foregoing transfer robot, the second rotation mechanism is substantially the only additional component, compared with existing transfer robots. Therefore, the complication of the structure can be prevented, for example compared with the case of providing a drive mechanism at the proximal end of the hand unit so as to swing the hand unit. In addition, adding the second rotation mechanism for rotating the rotary base contributes to suppressing the generation of particles, and preventing an increase in size of the transfer robot in the height direction, for example compared with the case of swinging the hand unit at the proximal end thereof.

EMBODIMENTS

Preferred embodiments of the present disclosure will be described below with reference to the accompanying drawings.

Figure 1:
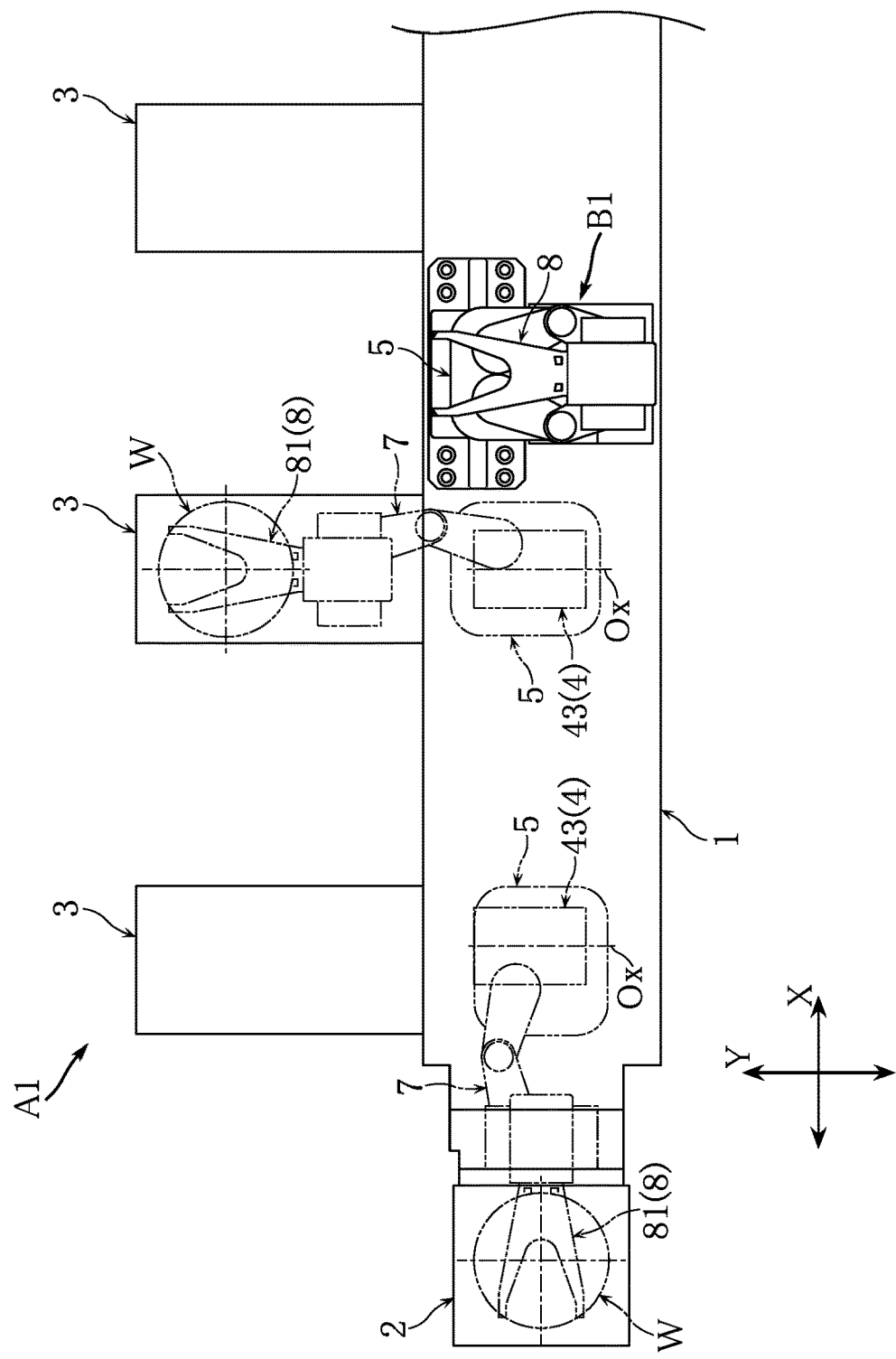
FIG. 1 is a plan view showing a work transfer system including a transfer robot according to the present disclosure.

FIG. 1 illustrates a work transfer system including a transfer robot according to an embodiment of the present disclosure. The illustrated work transfer system A1 includes a transfer chamber 1, a storage chamber 2, at least one processing chamber 3, and a transfer robot B1. The work transfer system A1 is configured to transfer thin plate-shaped works W, typically silicon wafers (circular in a plan view), for manufacturing semiconductor devices.

The transfer chamber 1 is formed in a generally rectangular parallelepiped shape having a predetermined internal space, and has a generally rectangular shape having long sides extending in a direction X in a plan view. The transfer robot B1 is accommodated inside the transfer chamber 1 and located at the center of the transfer chamber 1 in the direction X.

The storage chamber 2 is configured to accommodate therein, for example, a cassette or cassettes each for retaining a plurality of thin plate-shaped works W. The storage chamber 2 is located adjacent to an end portion of the transfer chamber 1 in the direction X. The work transfer system A1 includes at least one storage chamber 2. A plurality of storage chambers 2 may be aligned vertically with a spacing therebetween, or two (or more) storage chambers 2 may be located adjacent to the respective ends of the transfer chamber 1 (that are spaced from each other) in the direction X. The storage chamber 2 may be provided with an openable shutter (not shown) located at a predetermined position and configured to be opened or closed when a cassette is put into or taken out from the storage chamber 2. In addition, a non-illustrated openable shutter may be provided between the transfer chamber 1 and the storage chamber 2 to be used when the transfer robot B1 transfers the thin plate-shaped work W therebetween. The cassette in the storage chamber 2 is configured to accommodate, for example, up to 25 pieces of thin plate-shaped works W in a manner such that the works overlap with each other as viewed in the vertical direction.

The processing chamber 3 may be a diffusion furnace for heating the thin plate-shaped works W. In the illustrated example, a plurality of processing chambers 3 are located adjacent to the transfer chamber 1. More specifically, four processing chambers 3 (only three are shown in FIG. 1) are disposed along an elongated side or one of the two sides spaced from each other in a direction Y, which is perpendicular to the direction X and the vertical direction. These four processing chambers 3 are aligned in the direction X at predetermined intervals. Inside each of the processing chambers 3, a plurality (e.g., 60 pieces) of thin plate-shaped works W are placed in a manner such that they overlap with each other as viewed in the vertical direction. Between the transfer chamber 1 and each processing chamber 3 may be provided an openable shutter.

Figure 2:
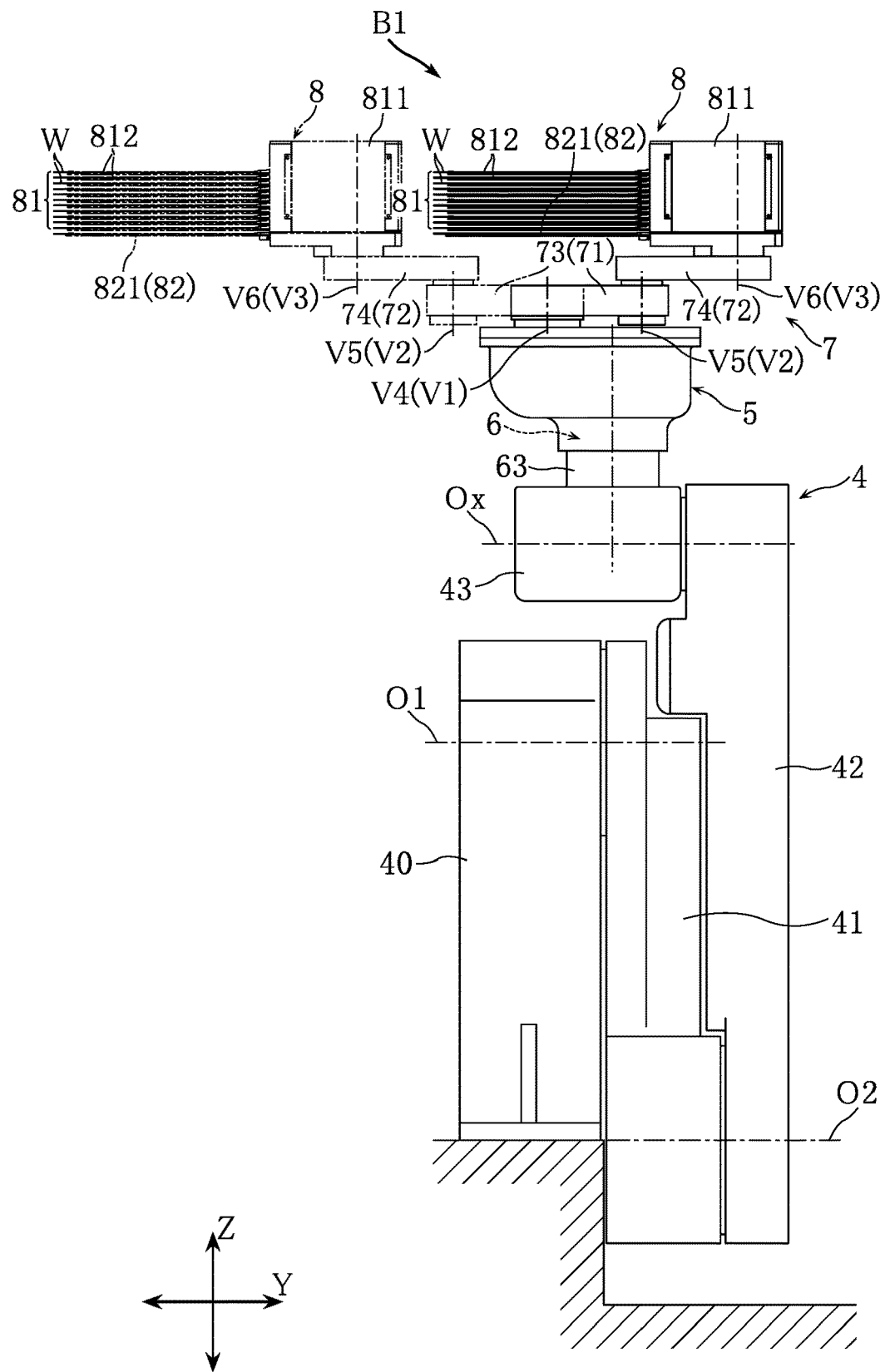
FIG. 2 is a left side view of the transfer robot.
Figure 3:
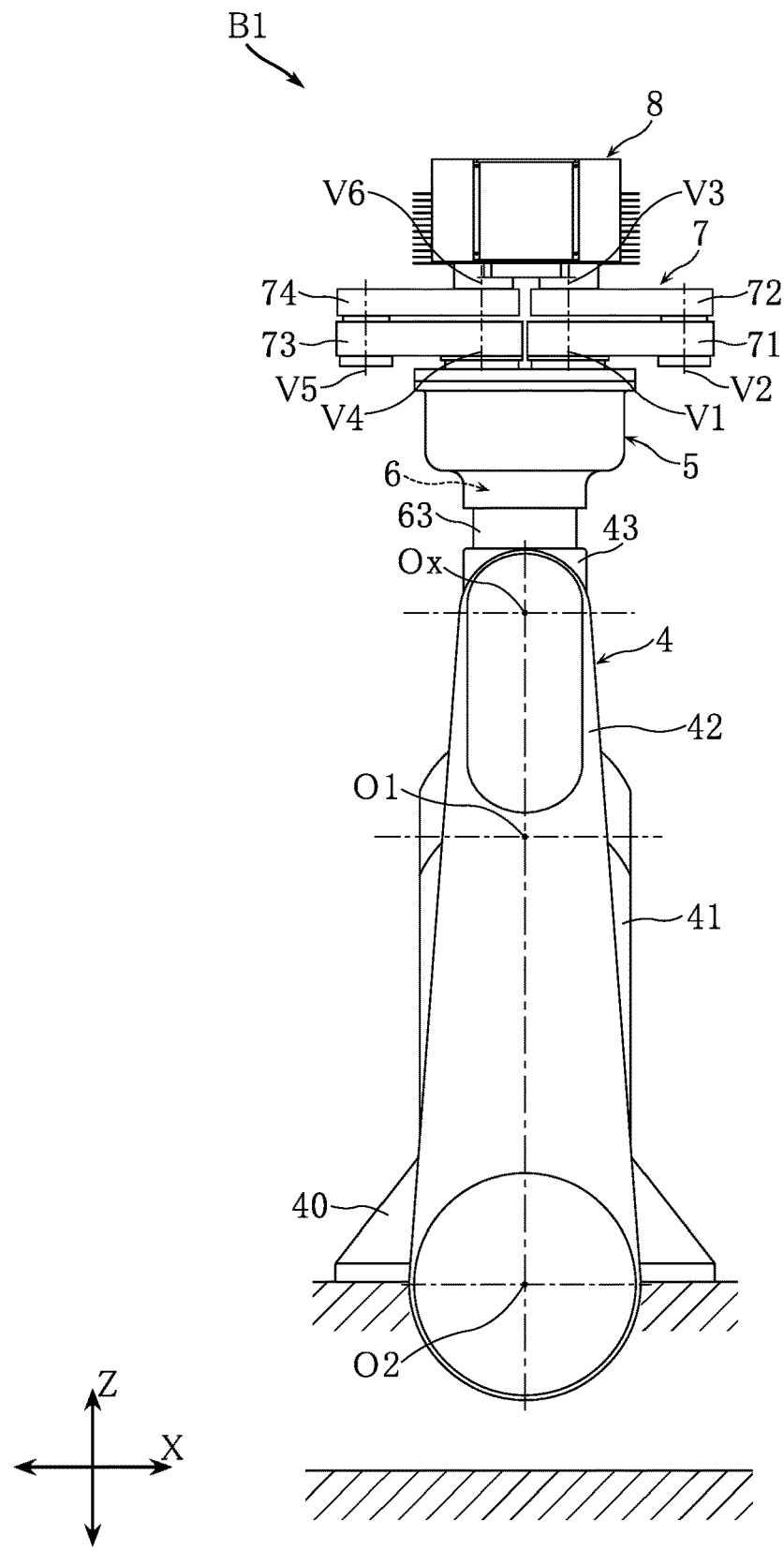
FIG. 3 is a front view of the transfer robot.

The transfer robot B1 serves to transfer the thin plate-shaped works W, between the storage chamber 2 and the processing chamber 3. As shown in FIG. 2 and FIG. 3, the transfer robot B1 includes a support unit 4, a rotary base 5, a rotation mechanism 6, a linear movement mechanism 7, and a hand unit 8.

The support unit 4 includes a fixed base 40, a first arm 41, a second arm 42, and a pivotal member 43. The fixed base 40 extends in the vertical direction Z and has the lower end portion fixed to the floor surface of the transfer chamber 1. The first arm 41 extends in a plane defined by the direction X and the vertical direction Z, and is supported by the fixed base 40. To be more detailed, the first arm 41 has the proximal end portion supported at the upper end portion of the fixed base 40, so as to pivot about a first horizontal axis O1 extending in the direction Y. The second arm 42 extends in a plane defined by the direction X and the vertical direction Z, and is supported by the first arm 41. To be more detailed, the second arm 42 has the proximal end portion supported at the distal end portion of the first arm 41, so as to pivot about a second horizontal axis O2 extending in the direction Y. The pivotal member 43 is supported by the second arm 42. To be more detailed, the pivotal member 43 is supported at the distal end portion of the second arm 42, so as to pivot about a pivotal axis Ox extending in the direction Y.

Though not illustrated in detail, the first arm 41 and the second arm 42 are driven to pivot about the first horizontal axis O1 and the second horizontal axis O2, for example by a motor and a power transmission unit including a belt mechanism and a reduction gear. By controlling the operation of the motor, the rotary base 5 supported by the support unit 4 can be located so as to face the storage chamber 2, or each of the processing chambers 3, as indicated by imaginary lines in FIG. 1.

The rotary base 5 is supported by the pivotal member 43 (support unit 4). As will be subsequently described in further detail, the rotary base 5 is driven to rotate by the rotation mechanism 6.

The hand unit 8 serves to support the thin plate-shaped works W of a circular shape. The hand unit 8 is supported by the rotary base 5, via the linear movement mechanism 7. In this embodiment, the hand unit 8 includes a multi-stage hand 81 and a hand 82. The multi-stage hand 81 includes a holder 811 and a plurality of forks 812, and the respective proximal end portions of the plurality of forks 812 are collectively held by the holder 811. The plurality of forks 812 overlap with each other as viewed in the vertical direction Z, and are aligned in the vertical direction Z at predetermined intervals. The hand 82 includes a fork 821 of a forked shape. Though not illustrated in detail, the forks 812 and the fork 821 each include a concave stepped portion located at a predetermined position, to place the circular and thin plate-shaped work W. In the multi-stage hand 81, a thin plate-shaped work W is supported by each of the plurality of forks 812, in other words a plurality (11 pieces in the example shown in FIG. 2) of thin plate-shaped works W can be supported, such that the works overlap with each other as viewed in the vertical direction Z. In the hand 82, a thin plate-shaped work W is placed on and supported by the fork 821.

The linear movement mechanism 7 serves to linearly move the hand unit 8 (multi-stage hand 81 and hand 82) in the horizontal direction. In this embodiment, the linear movement mechanism 7 includes hand driving arms 71, 72, 73, and 74, each having an elongate shape.

The hand driving arm 71 has the proximal end portion supported at a predetermined position in the upper portion of the rotary base 5, so as to pivot about a vertical axis V1. The hand driving arm 72 has the proximal end portion supported at the distal end portion of the hand driving arm 71, so as to pivot about a vertical axis V2. The multi-stage hand 81 (holder 811) has the proximal end portion supported at the distal end portion of the hand driving arm 72, so as to pivot about a vertical axis V3.

The hand driving arm 73 has the proximal end portion supported at a predetermined position in the upper portion of the rotary base 5, so as to pivot about a vertical axis V4. The hand driving arm 74 has the proximal end portion supported at the distal end portion of the hand driving arm 73, so as to pivot about a vertical axis V5. The hand 82 has the proximal end portion supported at the distal end portion of the hand driving arm 74, so as to pivot about a vertical axis V6.

Though not illustrated in detail, the linear movement mechanism 7 includes, for example, a motor serving as the drive source, and a power transmission unit including a belt mechanism and a reduction gear. By the collaboration of the motor and the power transmission unit, the hand driving arm 71, the hand driving arm 72, and the multi-stage hand 81 are respectively caused to pivot about the vertical axes V1, V2, and V3, and the hand driving arm 73, the hand driving arm 74, and the hand 82 are respectively caused to pivot about the vertical axes V4, V5, and V6. In addition, the multi-stage hand 81 and the hand can be linearly moved independent from each other, by controlling the operation of the motor. In FIG. 2, the multi-stage hand 81 and the hand 82 located right above the rotary base 5 in a stand-by state (reference position) are indicated by solid lines, and the multi-stage hand 81 and the hand 82 linearly moved in the horizontal direction, from the reference position to a position forward of the rotary base 5 (advanced position), are indicated by imaginary lines.

When the transfer robot B1 receives or delivers the thin plate-shaped work W from the storage chamber 2 or to the processing chamber 3, the rotary base 5 is brought to the front of the storage chamber 2 or processing chamber 3. Then the hand unit 8 (multi-stage hand 81 and hand 82) are oriented so as to face the storage chamber 2 or processing chamber 3, and then caused to advance to the position forward of the rotary base 5. Accordingly, the multi-stage hand 81 and the hand 82 proceed into the storage chamber 2 or processing chamber 3, to receive or deliver the thin plate-shaped work W, inside the storage chamber 2 or processing chamber 3. In FIG. 1, the multi-stage hand 81 located at the advanced position inside the storage chamber 2 or processing chamber 3 is indicated by imaginary lines.

Figure 6:
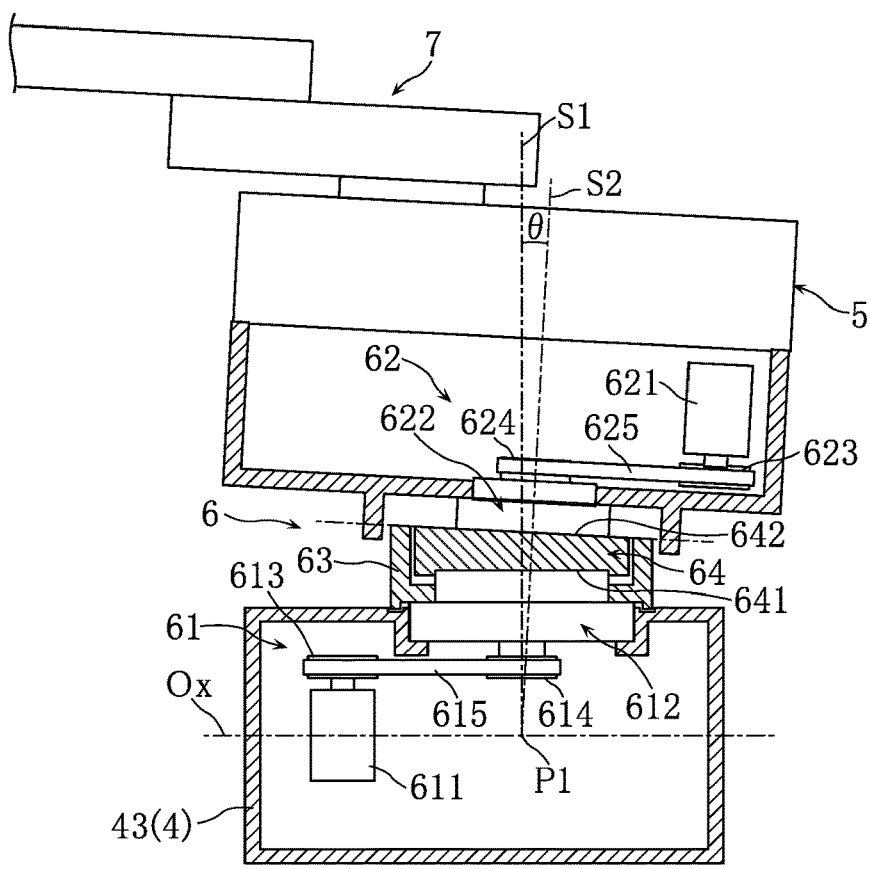
FIG. 6 is a partial cross-sectional view schematically showing a configuration of the rotation mechanism.

FIG. 6 schematically illustrates an example of the configuration of the rotation mechanism 6. The rotation mechanism 6, which serves to rotate the rotary base 5, includes a first rotation mechanism 61 and a second rotation mechanism 62. The first rotation mechanism 61 rotates the rotary base 5 relative to the support unit 4 (pivotal member 43), about a first rotation axis S1 extending in the vertical direction Z. The second rotation mechanism 62 rotates the rotary base 5 about a second rotation axis S2, inclined by a predetermined angle with respect to the first rotation axis S1.

The first rotation mechanism 61 includes, for example, a motor 611 and a reduction gear 612. The motor 611 is located inside the pivotal member 43. The reduction gear 612 is attached to an opening formed in the upper face of the pivotal member 43, so as to rotate relatively thereto. The rotation axis of the reduction gear 612 coincides with the first rotation axis S1. A pulley 613 is attached to the output shaft of the motor 611, and a pulley 614 is attached to the input shaft of the reduction gear 612. An endless belt 615 is wound around the pulleys 613 and 614.

The second rotation mechanism 62 includes, for example, a motor 621 and a reduction gear 622. The motor 621 is located inside the rotary base 5. The reduction gear 622 is attached to the lower face of the rotary base 5, facing an opening formed in the rotary base 5, in a manner such that it can rotate relative to the opening (or the rotary base 5). The rotation axis of the reduction gear 622 coincides with the second rotation axis S2. A pulley 623 is attached to the output shaft of the motor 621, and a pulley 624 is attached to the input shaft of the reduction gear 622. An endless belt 625 is wound around the pulleys 623 and 624.

A sloped member 64 is interposed between the reduction gear 612 and the reduction gear 622. The sloped member 64 includes a lower horizontal surface 641 and an upper sloped surface 642. The lower horizontal surface 641 extends along a horizontal plane, and the reduction gear 612 is attached to the lower horizontal surface 641. The upper sloped surface 642 is inclined by a predetermined angle with respect to the lower horizontal surface 641. The reduction gear 622 is attached to the upper sloped surface 642.

The first rotation axis S1 is perpendicular to the lower horizontal surface 641, and the second rotation axis S2 is perpendicular to the upper sloped surface 642. An inclination angle $\theta$ of the second rotation axis S2 with respect to the first rotation axis S1 is equal to the inclination angle of the upper sloped surface 642 with respect to the lower horizontal surface 641. The inclination angle $\theta$ of the second rotation axis S2 may be, without limitation, in a range of 0.5 to 3°, for example.

The reduction gears 612 and 622 may be constituted utilizing a strain wave gearing system such as a Harmonic Drive (registered trademark). Alternatively, a planet gear mechanism may be used for constituting the reduction gears 612 and 622.

In the illustrated example, a cylindrical member 63 is attached to the reduction gear 612. The cylindrical member 63, disposed between the pivotal member 43 and the rotary base 5, may surround the reduction gear 612, the sloped member 64, and the reduction gear 622.

Figure 4:
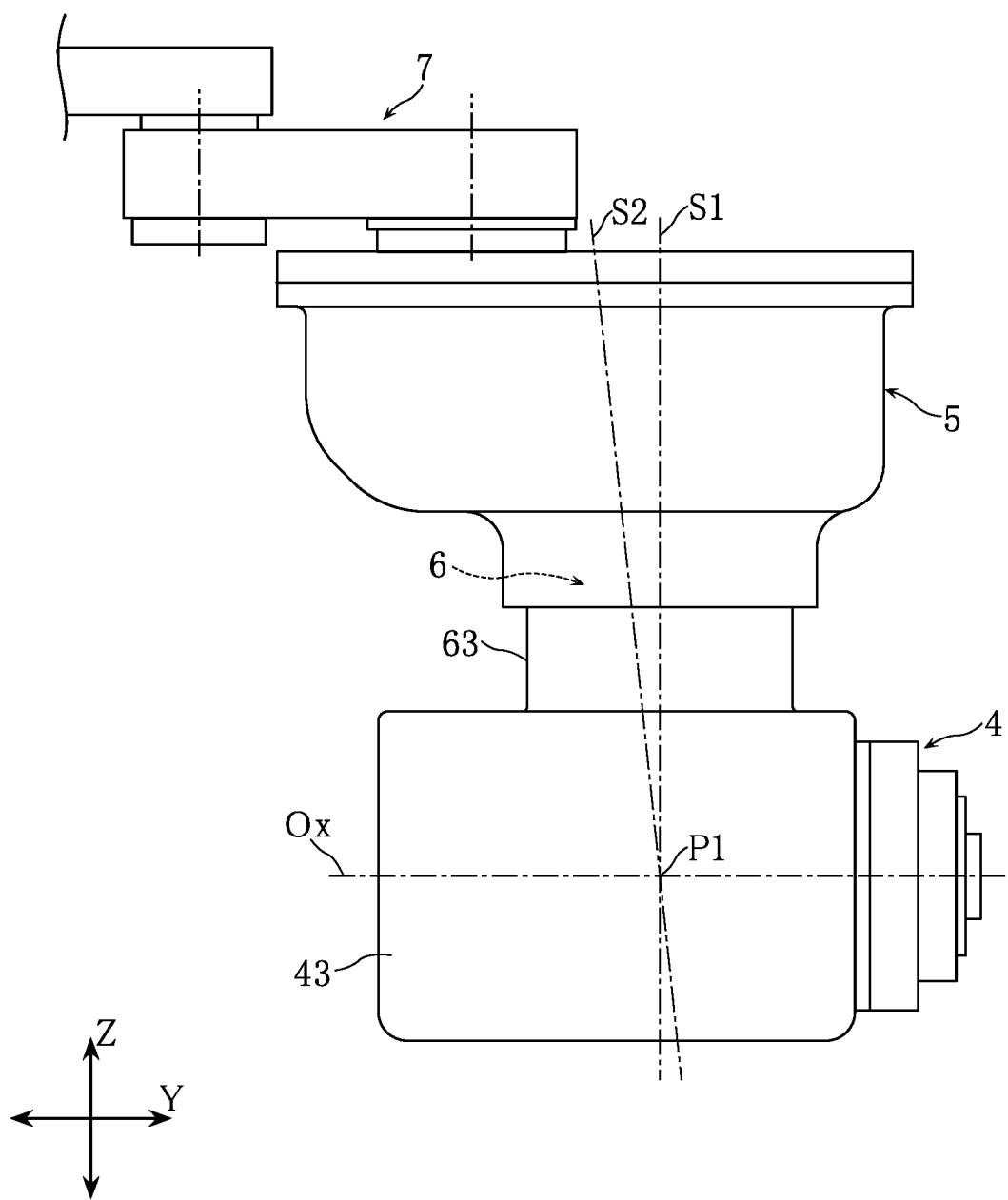
FIG. 4 is an enlarged partial left side view of the transfer robot, for explaining a rotation mechanism.
Figure 5:
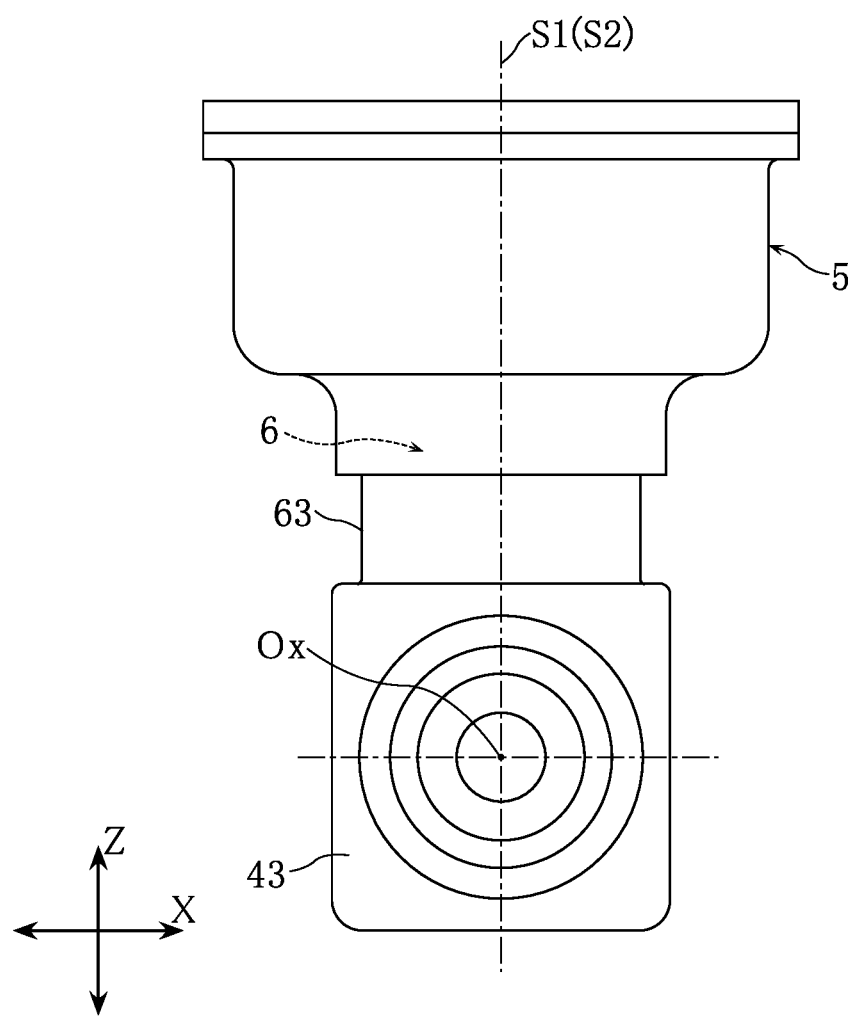
FIG. 5 is a front view of the portion shown in FIG. 4.

The first rotation axis S1 is perpendicular to the pivotal axis Ox (pivotal axis of pivotal member 43). In this embodiment, the first rotation axis S1 and the pivotal axis Ox are perpendicular to each other, as shown in FIG. 4 to FIG. 6. In this embodiment, further, the first rotation axis S1, the second rotation axis S2, and the pivotal axis Ox intersect at a specific point inside the pivotal member 43 (intersection P1), as shown in FIG. 6.

With the foregoing configuration, the rotary base 5 is supported by the support unit 4 (pivotal member 43), via the rotation mechanism 6 (first rotation mechanism 61 and second rotation mechanism 62). More specifically, the rotary base 5 is supported by the pivotal member 43, via the reduction gear 612, the sloped member 64, and the reduction gear 622.

The workings of the rotation mechanism 6 will be described below.

To rotate the rotary base 5, the motor 611 of the first rotation mechanism 61 is driven. Accordingly, the rotary base 5 is caused to rotate relative to the support unit 4, about the first rotation axis S1. For example, when the thin plate-shaped work W is delivered to or received from the storage chamber 2 shown in FIG. 1, the operation of the first rotation mechanism 61 (motor 611) is controlled, so as to rotate the rotary base 5. As indicated by the imaginary lines in FIG. 1, the rotary base 5 located in front of the storage chamber 2 is caused to rotate such that the hand unit 8 is faced to the storage chamber 2.

In addition, the inclination of the rotary base 5 can be changed, by simultaneously driving the first rotation mechanism 61 (motor 611) and the second rotation mechanism 62 (motor 621). To be more detailed, when the motor 611 is driven, the rotary base 5 is caused to rotate together with the sloped member 64 relative to the support unit 4, about the first rotation axis S1. At the same time, when the motor 621 is driven, the rotary base 5 is caused to rotate relative to the sloped member 64, about the second rotation axis S2.

At this point, the rotation speed of the rotary base 5 driven by the motor 611 (first rotation mechanism 61) about the first rotation axis S1, and the rotation speed of the rotary base 5 driven by the motor 621 (first rotation mechanism 62) about the second rotation axis S2 are set to be equal, and the reduction gears 612 and 622, respectively engaged with the motors 611 and 621, are set to rotate in opposite directions. Accordingly, the rotation of the rotary base 5 relative to the support unit 4 is cancelled, and the rotary base 5 is kept from rotating. On the other hand, the sloped member 64 rotates relative to the support unit 4 about the first rotation axis S1, by a predetermined angle. Therefore, the inclination direction of the upper sloped surface 642 of the sloped member 64 is changed, so that the inclination status of the rotary base 5, supported by the sloped member 64, is also changed.

The change in inclination status of the rotary base 5 will be described in further detail, with reference to FIG. 7 to FIG. 12.

Figure 7:
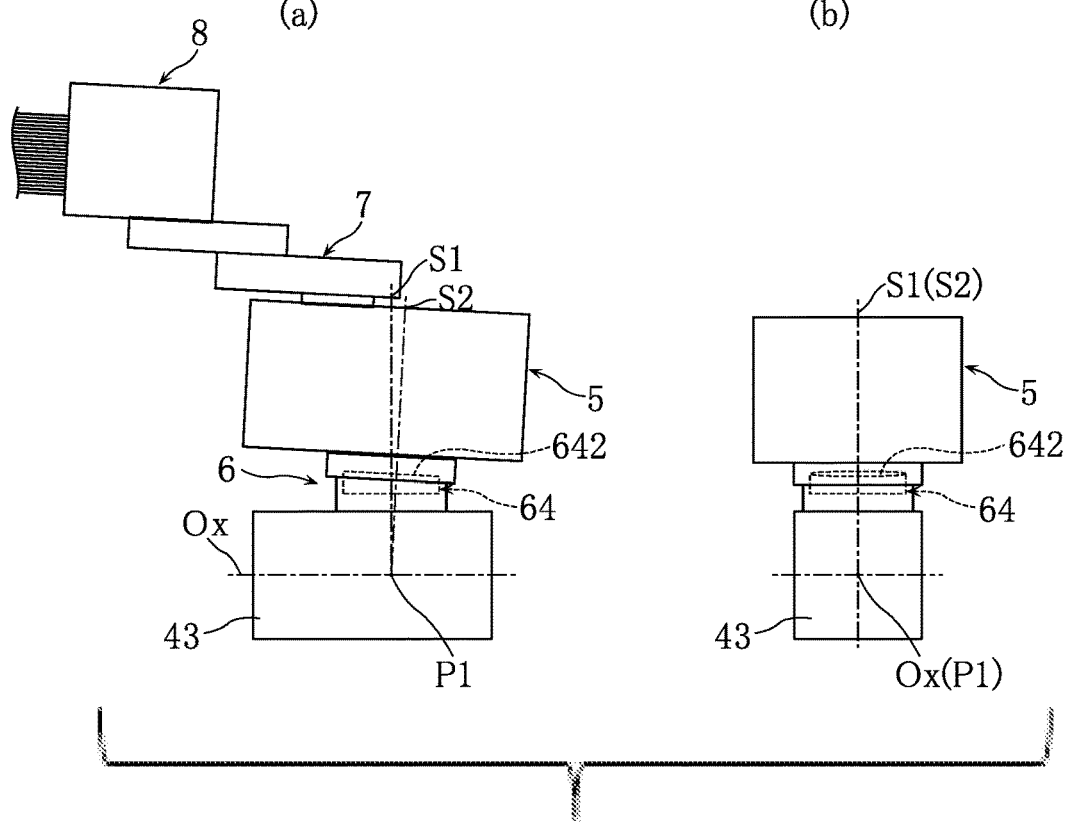
FIG. 7 illustrates a change in tilting status of a rotary base.

FIG. 7, corresponding in inclination angel to FIG. 6, illustrates the positions of the pivotal member 43, the rotary base 5, the sloped member 64, the linear movement mechanism 7, and the hand unit 8. In FIG. 7, (a) shows the left side view, and (b) shows the front view. In the rotary base 5, the direction in which the hand unit 8 is caused to advance (to the left in FIG. 7(*a*)) corresponds to the forward direction, and the opposite direction (to the right in FIG. 7(*a*)) corresponds to the backward direction. In FIG. 7(*b*), the linear movement mechanism 7 and the hand unit 8 are omitted (the same omission applies to FIG. 8(*b*), FIG. 10(*b*), and FIG. 12(*b*)).

In FIG. 7, the sloped member 64 is inclined so that the front portion of the rotary base 5 is elevated with respect to the rear portion of the same base. Accordingly, the rotary base 5 is inclined such that the front portion is located at a higher level than the rear portion, as shown in FIG. 7(*a*). As viewed from the front (FIG. 7(*b*)), however, the rotary base 5 is levelled (horizontally balanced) so as not to be inclined with respect to the horizontal direction (left-right direction).

Figure 8:
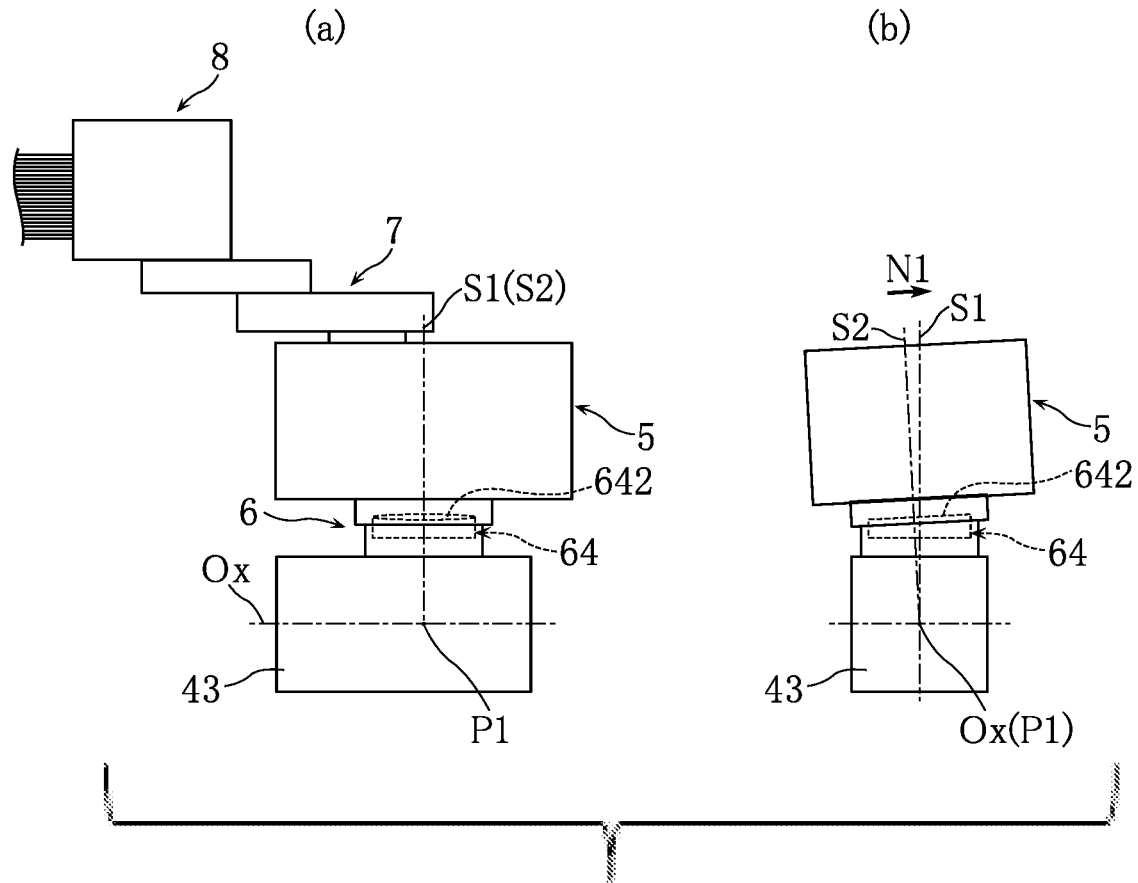
FIG. 8 illustrates a change in tilting status of the rotary base.

FIG. 8 illustrates a state where the rotary base 5 has been rotated clockwise by the first rotation mechanism 61 by 90 degrees about the first rotation axis S1 in a plan view (starting from the state shown in FIG. 7), and further rotated counterclockwise by the second rotation mechanism 62 by 90 degrees about the second rotation axis S2. Accordingly, the inclination direction of the sloped member 64 is changed, such that the left portion of the sloped member 64 becomes lower than the right portion, as viewed from the front of the rotary base 5. At this point, the rotary base 5 becomes horizontal in the front-back direction, as viewed from either side, as shown in FIG. 8(*a*), while the rotary base 5 is inclined such that the left portion becomes lower as viewed from the front, as shown in FIG. 8(*b*).

Figure 9:
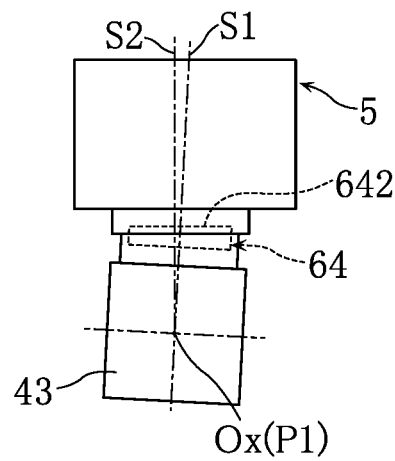
FIG. 9 is a schematic drawing for explaining a change in tilting status of the rotary base.

Further, as indicated by an arrow N1 in FIG. 8B, the pivotal member 43 is caused to pivot about the pivotal axis Ox. Since the first rotation axis S1 and the second rotation axis S2 both pass the intersection P1 on the pivotal axis Ox, making the pivotal member 43 pivot about the pivotal axis Ox by a predetermined angle allows the rotary base 5 to assume a horizontal posture in the left-right direction as viewed from the front, as shown in FIG. 9. At this point, the second rotation axis S2 is aligned with the vertical direction, as viewed from the front of the rotary base 5. It should be noted that by causing the pivotal member 43 to pivot appropriately in synchronization with the rotating motion of the rotary base 5, it is possible to substantially prevent the rotary base 5 from becoming inclined in the left-right direction while the base is in rotation.

Figure 10:
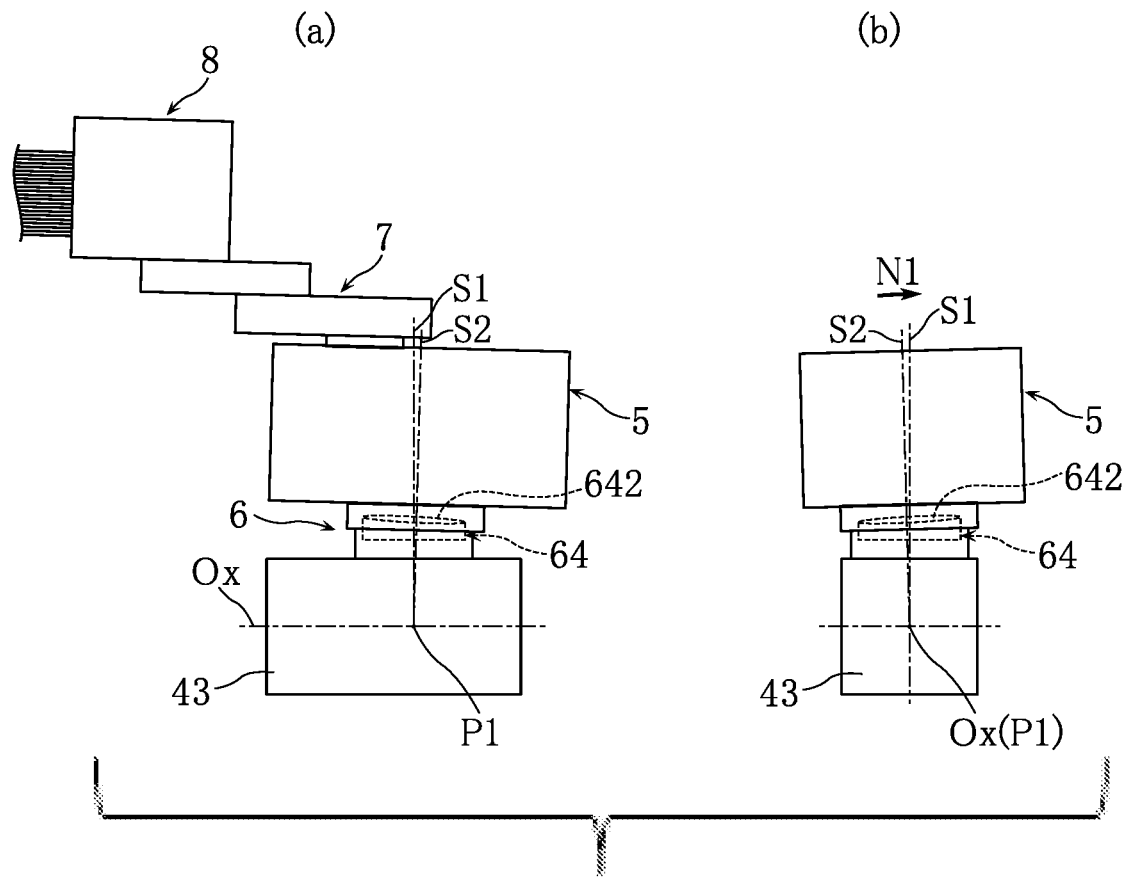
FIG. 10 illustrates a change in tilting status of the rotary base.

FIG. 10 illustrates a state where the rotary base 5 has been rotated clockwise by the first rotation mechanism 61 by 45 degrees about the first rotation axis S1 in a plan view (starting from the state shown in FIG. 7), and further rotated counterclockwise by the second rotation mechanism 62 by 45 degrees about the second rotation axis S2. Accordingly, the inclination direction of the sloped member 64 is changed, such that the rear portion of the sloped member 64 becomes lower as viewed from either side of the rotary base 5, and that the left portion becomes lower as viewed from the front of the rotary base 5, as shown in FIG. 10(*a*). At this point, the inclination angle of the rotary base 5 in the front-back direction shown in FIG. 10(*a*) is smaller than that of the rotary base 5 shown in FIG. 7(*a*). In addition, the inclination angle of the rotary base 5 in the left-right direction shown in FIG. 10(*b*) is smaller than that of the rotary base 5 shown in FIG. 8(*b*).

Figure 11:
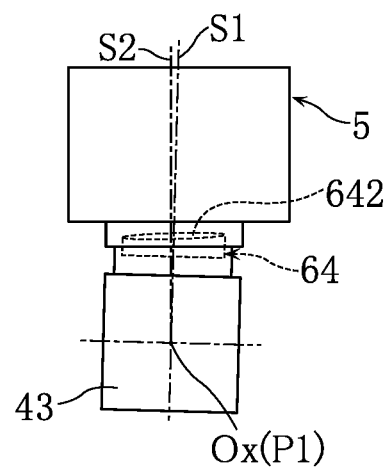
FIG. 11 is a schematic drawing for explaining a change in tilting status of the rotary base.

Further, as indicated by an arrow N1 in FIG. 10B, the pivotal member 43 is caused to pivot about the pivotal axis Ox. Since the first rotation axis S1 and the second rotation axis S2 both pass the intersection P1 on the pivotal axis Ox, causing the pivotal member 43 to pivot about the pivotal axis Ox by a predetermined angle allows the rotary base 5 to assume a horizontal posture in the left-right direction as viewed from the front, as shown in FIG. 11. At this point, the second rotation axis S2 is aligned with the vertical direction, as viewed from the front of the rotary base 5. It should be noted that by causing the pivotal member 43 to pivot appropriately in synchronization with the rotating motion of the rotary base 5, it is possible to substantially prevent the rotary base 5 from becoming inclined in the left-right direction while the base is in rotation.

Figure 12:
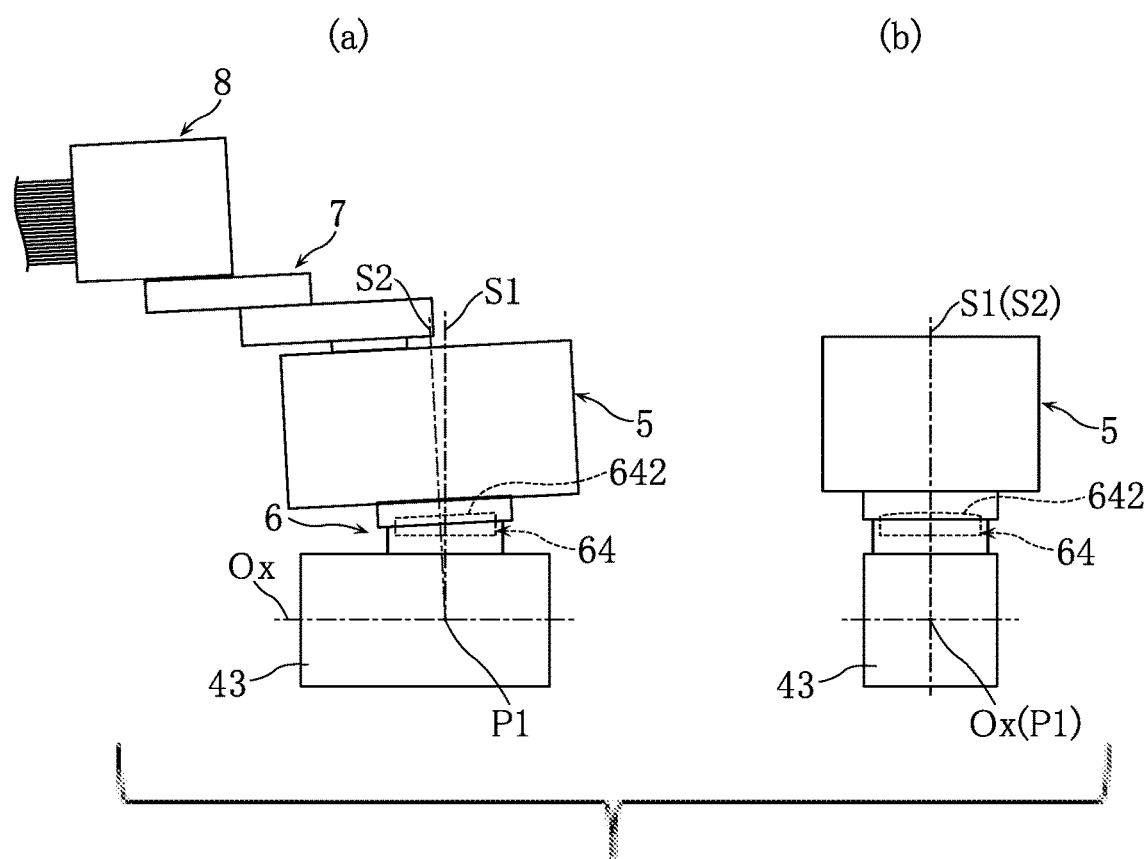
FIG. 12 illustrates a change in tilting status of the rotary base.

FIG. 12 illustrates a state where the rotary base 5 has been rotated clockwise by the first rotation mechanism 61 by 180 degrees about the first rotation axis S1 in a plan view (starting from the state shown in FIG. 7), and further rotated counterclockwise by the second rotation mechanism 62 by 180 degrees about the second rotation axis S2. Accordingly, the inclination direction of the sloped member 64 is changed, such that the front portion of the sloped member 64 becomes lower as viewed from either side of the rotary base 5. At this point, the rotary base 5 is inclined such that the front portion becomes lower as viewed from either side thereof, as shown in FIG. 12(a), while the rotary base 5 assumes a horizontal posture in the left-right direction as viewed from the front, as shown in FIG. 12(b).

While the rear portion of the rotary base 5 is lower in FIG. 7(a), the front portion of the rotary base 5 is lower in FIG. 12(a). In the illustrated example, the respective inclination angles (absolute values) of the rotary base 5 shown in FIG. 12(a) and FIG. 7(a) are equal to each other. As understood from FIG. 7(b), FIG. 8(b) and FIG. 12(b), when the pivotal motion of the pivotal member 43 is stopped while the rotary base 5 is rotating, the rotary base 5 becomes inclined in the left-right direction. However, by appropriately causing the pivotal member 43 to pivot appropriately in synchronization with the rotating motion of the rotary base 5, the rotary base 5 can be prevented from becoming inclined in the left-right direction in its rotation.

The embodiment provides the following advantageous effects.

In the transfer robot B1 according to the embodiment, the rotation mechanism 6 for rotating the rotary base 5 includes the first rotation mechanism 61 and the second rotation mechanism 62. The first rotation mechanism 61 rotates the rotary base 5 relative to the support unit 4 (pivotal member 43) about the first rotation axis S1 extending in the vertical direction Z. The second rotation mechanism 62 rotates the rotary base 5 about the second rotation axis S2 inclined by the predetermined angle with respect to the first rotation axis S1. The pivotal member 43 supporting the rotary base 5 is configured to pivot about the pivotal axis Ox perpendicular to the first rotation axis S1.

To deliver the thin plate-shaped work W with the transfer robot B1, for example to the processing chamber 3, the hand unit 8 supported by the rotary base 5 is moved by the linear movement mechanism 7 to a position forward of the rotary base 5, so as to proceed into the processing chamber 3. At this point, since the hand unit 8 is separated from the rotary base 5 in a cantilever manner, the components of the linear movement mechanism 7 may be distorted, owing to the self-weight of the linear movement mechanism 7, the hand unit 8, and the thin plate-shaped work W, which may cause the hand unit 8 to tilt, in the front-back direction of the rotary base 5. Even in such a case, only the inclination of the rotary base 5 in the front-back direction can be adjusted, without rotating the rotary base 5, by the collaboration of the rotation mechanism 6 (first rotation mechanism 61 and second rotation mechanism 62) and the pivotal member 43, as described above with reference to FIG. 7 to FIG. 12. Therefore, the transfer robot B1 allows the hand unit 8 to maintain the horizontal posture when delivering the thin plate-shaped work W, thereby allowing the thin plate-shaped work W to be properly delivered.

In the transfer robot B1 according to this embodiment, configured to receive and deliver the thin plate-shaped work W from the storage chamber 2 and to the processing chamber 3, the second rotation mechanism 62 is substantially the only additional component, compared with the existing transfer robots. Therefore, the complication of the structure can be prevented, for example compared with the case of providing a drive mechanism at the proximal end of the hand unit 8 so as to swing the hand unit 8. In addition, adding the second rotation mechanism 62 for rotating the rotary base 5 contributes to suppressing the generation of particles, and preventing an increase in size of the transfer robot B1 in the height direction, for example compared with the case of swinging the hand unit 8 at the proximal end thereof.

As apparent from the description given with reference to FIG. 7 to FIG. 12, the adjustment range of the inclination angle of the rotary base 5 in the front-back direction is relatively small. In this embodiment, the inclination angle of the rotary base 5 in the front-back direction can be adjusted, within the rotation range of the rotary base 5 not exceeding 180 degrees, about the first rotation axis S1 and the second rotation axis S2. Such a configuration enables the inclination angle of the rotary base 5 in the front-back direction to be adjusted in fine increments and with high accuracy, according to the rotation angle adjustment of the rotary base 5 in a wide angle range.

In this embodiment, the first rotation axis S1 of the first rotation mechanism 61, the second rotation axis S2 of the second rotation mechanism 62, and the pivotal axis Ox of the pivotal member 43 intersect at the intersection P1, inside the pivotal member 43. Therefore, as described above with reference to FIG. 7 to FIG. 12, although the rotary base 5 is inclined in the left-right direction as viewed from the front, owing to the adjustment of the inclination of the rotary base 5 in the front-back direction, such inclination in the left-right direction can be easily cancelled by making the pivotal member 43 pivot about the pivotal axis Ox by a predetermined angle, so that the rotary base 5 can maintain the horizontal posture in the left-right direction.

In this embodiment, the hand unit 8 includes the multi-stage hand 81 (first hand) and the hand 82 (second hand). The multi-stage hand 81 and the hand 82 are linearly moved by the linear movement mechanism 7, independent from each other. Accordingly, the inclination of the hand unit 8 may vary, depending on whether both or one of the multi-stage hand 81 and the hand 82 are to be used, to receive or deliver the thin plate-shaped work W. Even in such a case, the inclination of the rotary base 5 in the front-back direction can be adjusted as desired, so that the hand unit 8 can assume the horizontal posture, to receive or deliver the thin plate-shaped work W.

The multi-stage hand 81 supports the plurality of thin plate-shaped works W, such that the works overlap with each other as viewed in the vertical direction Z. Such an arrangement enables a required number of thin plate-shaped works W to be efficiently transferred, between the storage chamber 2 and the processing chamber 3.

The support unit 4 includes the fixed base 40 extending in the vertical direction, the first arm 41, the second arm 42, and the pivotal member 43. The first arm 41 has the proximal end portion supported at the upper end portion of the fixed base 40, so as to pivot about the first horizontal axis O1 extending in the horizontal direction Y. The second arm 42 has the proximal end portion supported at the distal end portion of the first arm 41, so as to pivot about the second horizontal axis O2 extending in the direction Y. The pivotal member 43 is supported at the distal end portion of the second arm 42, about the pivotal axis Ox extending in the direction Y. Such a configuration allows the rotary base 5 supported by the support unit 4 to be properly located, for example, in front of the storage chamber 2 or processing chamber 3 spaced from one another in the direction X, which is perpendicular to the direction Y, in a plan view.

Although the embodiment of the present disclosure has been described as above, the scope of the present disclosure is not limited to the foregoing embodiment, and all modifications within the scope of the appended claims are included in the present disclosure.

Although the support unit 4 includes the fixed base 40, the first arm 41, and the second arm 42 in the foregoing embodiment, different configurations may be adopted. The configuration of the support unit 4 may be modified as desired, provided that the support unit 4 can move the rotary base 5 to a predetermined position.

Although the linear movement mechanism includes the plurality of hand driving arms pivotably connected to each other, in the foregoing embodiment, different configurations may be adopted. For example, the linear movement mechanism may include a slider set to move linearly. Further, the specific configuration of the rotation mechanism 6 (first rotation mechanism 61 and second rotation mechanism 62) is not limited to the foregoing embodiment.

The invention claimed is:

1. A transfer robot comprising:
   a support unit;
   a rotary base supported by the support unit;
   a rotation mechanism that rotates the rotary base;
   a hand unit supported by the rotary base and configured to support a work; and
   a linear movement mechanism that moves the hand unit in a horizontal direction relative to the rotary base,
   wherein the rotation mechanism includes a first rotation mechanism and a second rotation mechanism, the first rotation mechanism being configured to rotate the rotary base relative to the support unit about a first rotation axis extending in a vertical direction, the second rotation mechanism being configured to rotate the rotary base about a second rotation axis inclined by a predetermined angle with respect to the first rotation axis, and
   the support unit includes a pivotal member that pivots about a pivotal axis perpendicular to the first rotation axis.

2. The transfer robot according to claim 1, wherein the first rotation axis, the second rotation axis and the pivotal axis intersect at a point located inside the pivotal member.

3. The transfer robot according to claim 1, wherein the hand unit includes a first hand and a second hand that are linearly moved and operated independently from each other by the linear movement mechanism.

4. The transfer robot according to claim 3, wherein the first hand supports a plurality of thin plate-shaped works in a manner such that the plurality of thin plate-shaped works overlap with each other as viewed in the vertical direction.

5. The transfer robot according to claim 1, wherein the support unit includes a fixed base extending in the vertical direction, a first arm, and a second arm, the first hand having a first proximal end portion supported at an upper end portion of the fixed base in a manner such that the first proximal end portion is capable of pivoting about a first horizontal axis extending in a first direction, the second arm having a second proximal end portion supported at a distal end portion of the first arm in a manner such that the second proximal end portion is capable of pivoting about a second horizontal axis extending in the first direction, and
   the pivotal member is supported at a distal end portion of the second arm so as to pivot about the pivotal axis extending in the first direction.

6. A work transfer system comprising:
   a transfer robot according to claim 5;
   a transfer chamber in which the transfer robot is located;
   at least one storage chamber located adjacent to the transfer chamber for storing the work; and
   a plurality of processing chambers for subjecting the work to a predetermined process,
   wherein the transfer chamber extends in a second direction perpendicular to the first direction and the vertical direction,
   the at least one storage chamber is located adjacent to an end portion of the transfer chamber in the second direction, and
   the plurality of processing chambers are each located adjacent to an end portion of the transfer chamber in the first direction, and aligned in the second direction at predetermined intervals.

* * * * *